(12) United States Patent
Hatakeyama et al.

(10) Patent No.: US 11,075,355 B2
(45) Date of Patent: Jul. 27, 2021

(54) LIGHT-EMITTING DEVICE

(71) Applicants: PIONEER CORPORATION, Tokyo (JP); TOHOKU PIONEER CORPORATION, Tendo (JP)

(72) Inventors: Hirotsugi Hatakeyama, Yonezawa (JP); Shinsuke Tanaka, Yonezawa (JP); Shinji Nakajima, Yonezawa (JP)

(73) Assignees: PIONEER CORPORATION, Tokyo (JP); TOHOKU PIONEER CORPORATION, Yamagata (JP)

( * ) Notice: Subject to any disclaimer, the term of this patent is extended or adjusted under 35 U.S.C. 154(b) by 0 days.

(21) Appl. No.: 16/283,686

(22) Filed: Feb. 22, 2019

(65) Prior Publication Data

US 2019/0207142 A1 Jul. 4, 2019

Related U.S. Application Data

(62) Division of application No. 15/531,393, filed as application No. PCT/JP2014/081637 on Nov. 28, 2014, now Pat. No. 10,243,165.

(51) Int. Cl.
*H01L 51/52* (2006.01)
*H05B 33/04* (2006.01)
*H01L 51/00* (2006.01)

(52) U.S. Cl.
CPC ........ *H01L 51/524* (2013.01); *H01L 51/0097* (2013.01); *H01L 51/5203* (2013.01);
(Continued)

(58) Field of Classification Search
CPC ............. H01L 51/0016; H01L 51/0097; H01L 51/5203; H01L 51/524; H01L 51/5246; H05B 33/04
See application file for complete search history.

(56) References Cited

U.S. PATENT DOCUMENTS 4,767,679 A * 8/1988 Kawachi ................ H05B 33/04
313/503
5,811,177 A * 9/1998 Shi ...................... H01L 51/5259
428/209

(Continued)

FOREIGN PATENT DOCUMENTS

JP 11040344 A 2/1999
JP 2004079291 A 3/2004
(Continued)

OTHER PUBLICATIONS

Office Action for related JP App No. 2016-561204 dated Jan. 23, 2018, 2 pgs.

(Continued)

*Primary Examiner* — Mohammed Shamsuzzaman
(74) *Attorney, Agent, or Firm* — Procopio, Cory, Hargreaves & Savitch LLP

(57) ABSTRACT

A light-emitting unit (140) is formed over a first surface (102) of a substrate (100). A first terminal (112) and a second terminal (132) are formed on the first surface (102) of the substrate (100), and are electrically connected to the light-emitting unit (140). A sealing layer (200) is formed over the first surface (102) of the substrate (100), and seals the light-emitting unit (140). In addition, the sealing layer (200) does not cover the first terminal (112) and the second terminal (132). A cover layer (210) is formed over the sealing layer (200), and is formed of a material different from that of the cover layer (210). In at least a portion of a region located next to the first terminal (112) and a region located next to the second terminal (132), a portion of an end of the cover layer (210) protrudes from the sealing layer (200).

8 Claims, 15 Drawing Sheets

(52) U.S. Cl.
CPC ......... *H01L 51/5246* (2013.01); *H05B 33/04* (2013.01); *H01L 51/0016* (2013.01)

(56) References Cited

U.S. PATENT DOCUMENTS

| | | | | |
|---|---|---|---|---|
| 8,018,153 | B2* | 9/2011 | Gotou | H01L 51/5259 |
| | | | | 313/504 |
| 9,088,006 | B2 | 7/2015 | Yamazaki et al. | |
| 9,853,245 | B2* | 12/2017 | Kim | H01L 51/0533 |
| 10,243,165 | B2 | 3/2019 | Hatakeyama et al. | |
| 2007/0054430 | A1* | 3/2007 | Nishigaki | H01L 51/5253 |
| | | | | 438/29 |
| 2008/0185960 | A1* | 8/2008 | Koshiyama | H01L 51/524 |
| | | | | 313/512 |
| 2009/0153042 | A1* | 6/2009 | Izumi | H01L 27/3258 |
| | | | | 313/504 |
| 2013/0092972 | A1* | 4/2013 | Kim | H01L 51/5256 |
| | | | | 257/100 |
| 2013/0299789 | A1 | 11/2013 | Yamazaki et al. | |
| 2014/0120249 | A1 | 5/2014 | Kimura et al. | |
| 2014/0285914 | A1 | 9/2014 | Sakano et al. | |
| 2015/0048326 | A1* | 2/2015 | Cho | H01L 51/5253 |
| | | | | 257/40 |
| 2015/0325812 | A1 | 11/2015 | Yamazaki et al. | |
| 2016/0285031 | A1* | 9/2016 | Hofling | H01L 51/0096 |

FOREIGN PATENT DOCUMENTS

| | | |
|---|---|---|
| JP | 2007080569 A | 3/2007 |
| JP | 2012042662 A | 3/2012 |
| JP | 2014086114 A | 5/2014 |
| JP | 2014186169 A | 10/2014 |
| JP | 2014197522 A | 10/2014 |
| JP | 2019024007 A | 2/2019 |
| WO | 2014141463 A1 | 9/2014 |
| WO | 2016084256 A1 | 6/2016 |

OTHER PUBLICATIONS

International Search Report and Written Opinion for PCT App No. PCT/JP2014/081637 dated Jan. 27, 2015, 9 pgs.
Office Action for related JP App No. 2018-170748 dated Jun. 18, 2019, 4 pgs.
Office Action for related JP App. No. 2019173933 dated Sep. 8, 2020. 2 pages.

* cited by examiner

LIGHT-EMITTING DEVICE

CROSS-REFERENCE TO RELATED APPLICATIONS

This application is a divisional of U.S. patent application Ser. No. 15/531,393, filed on May 26, 2017, which is a U.S. National Stage entry of PCT Application No. PCT/JP2014/081637, filed on Nov. 28, 2014. The contents of the foregoing are incorporated by reference.

TECHNICAL FIELD

The present invention relates to a light-emitting device.

BACKGROUND ART

In recent years, there has been progress in the development of light-emitting devices including organic electroluminescence (EL) elements in light-emitting units. The organic EL element has a configuration in which an organic layer is interposed between a first electrode and a second electrode. Since the organic layer is vulnerable to moisture and oxygen, the light-emitting unit is required to be sealed. One method for sealing the light-emitting unit is by using a sealing layer. Examples of methods of forming the sealing layer include vapor phase film formation methods such as atomic layer deposition (ALD), CVD, and sputtering.

Meanwhile, Patent Document 1 discloses using a lift-off method when forming a convex pattern on a magnetic recording layer.

RELATED DOCUMENT

Patent Document

[Patent Document 1] Japanese Unexamined Patent Application Publication No. 2014-86114

SUMMARY OF THE INVENTION

A substrate of a light-emitting device includes, in addition to the above-described light-emitting unit, a terminal connected to the light-emitting unit. However, since a sealing layer generally formed using a vapor phase method will also cover the terminal. For this reason, the sealing layer formed over the terminal needs to be removed.

An exemplary problem to be solved by the present invention is to facilitate removal of a sealing layer present over a terminal.

According to the invention of claim 1, there is provided a light-emitting device including: a substrate; a light-emitting unit formed over the substrate; a terminal which is formed on the substrate, and is electrically connected to the light-emitting unit; a sealing layer, formed over the substrate, which seals the light-emitting unit and does not cover the terminal; and a cover layer which is formed over the sealing layer, and is formed of a material different from that of the sealing layer, wherein an end of the cover layer is located further outside than an end of the sealing layer, in at least a portion of a region located next to the terminal.

BRIEF DESCRIPTION OF THE DRAWINGS

The above and other objects, features and advantages will be made clearer from certain preferred embodiments described below, and the following accompanying drawings.

DESCRIPTION OF EMBODIMENTS

Figure 1:
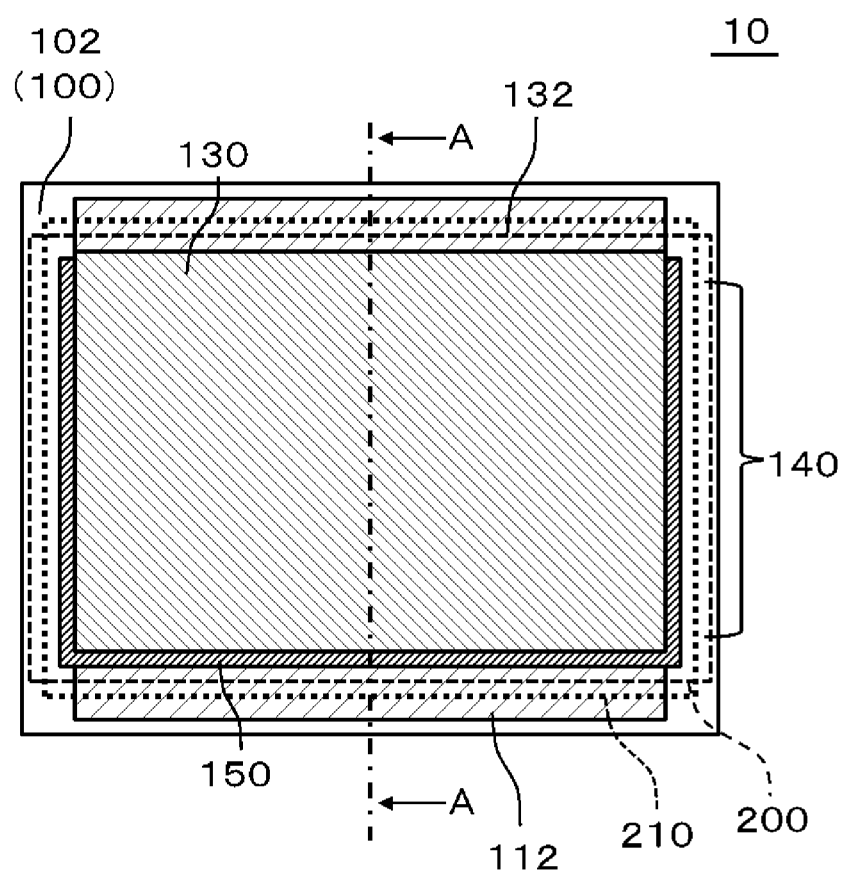
FIG. 1 is a plan view illustrating a configuration of a light-emitting device according to a first embodiment.

Hereinafter, an embodiment of the present invention will be described with reference to the accompanying drawings. In all the drawings, like elements are referenced by like reference numerals and the descriptions thereof will not be repeated.

First Embodiment

Figure 2:
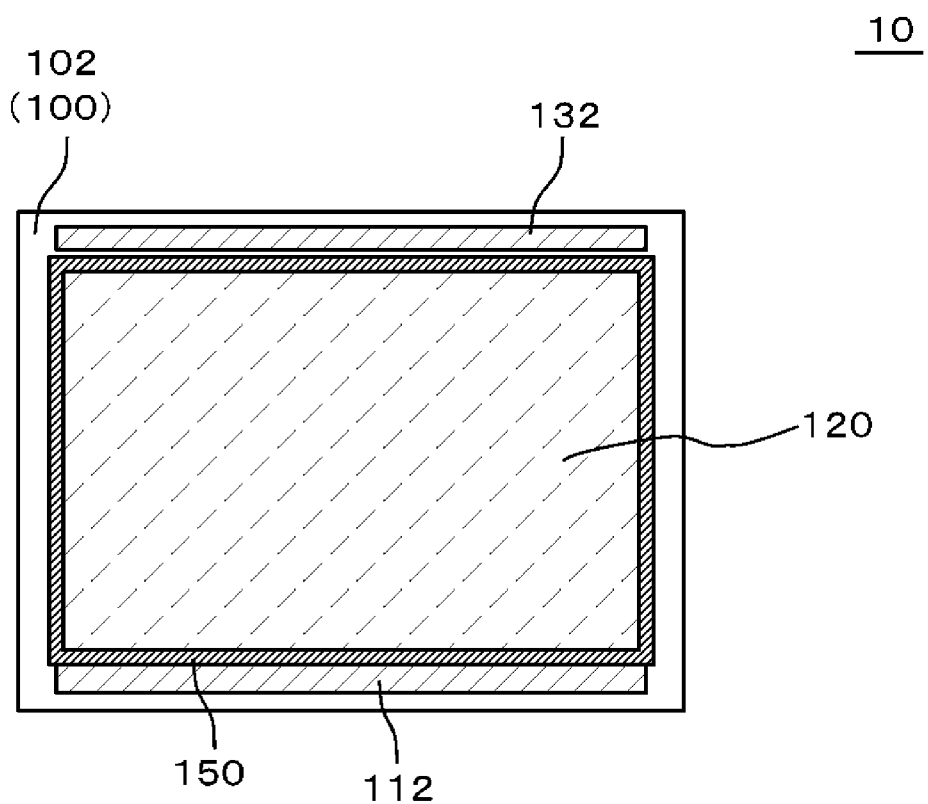
FIG. 2 is a diagram in which a cover layer, a sealing layer, and a second electrode are removed from FIG. 1.
Figure 3:
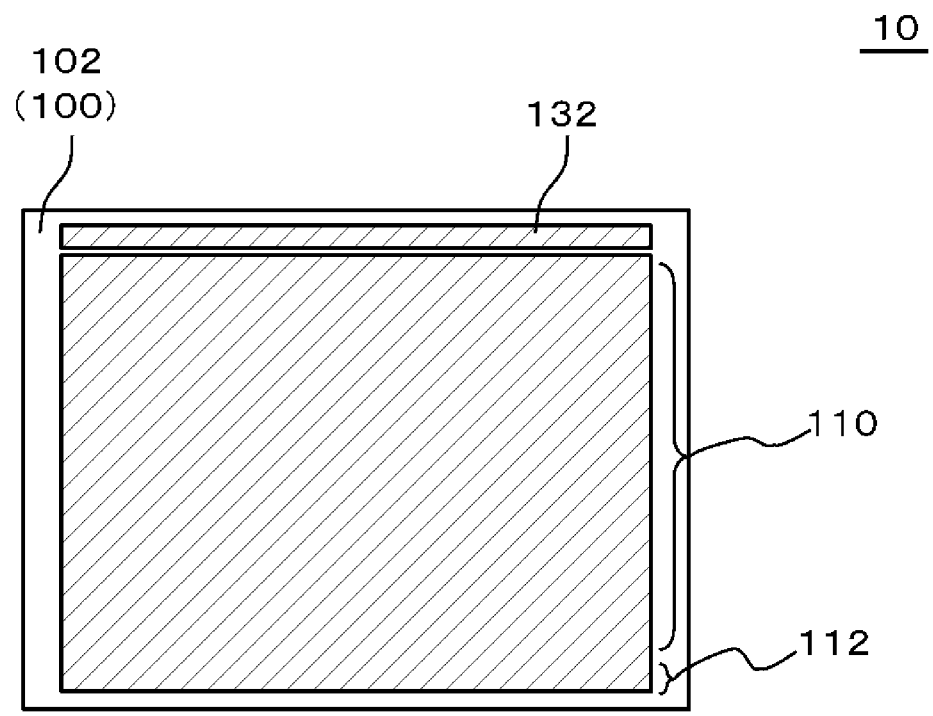
FIG. 3 is a diagram in which an insulating layer and an organic layer are removed from FIG. 2.
Figure 4:
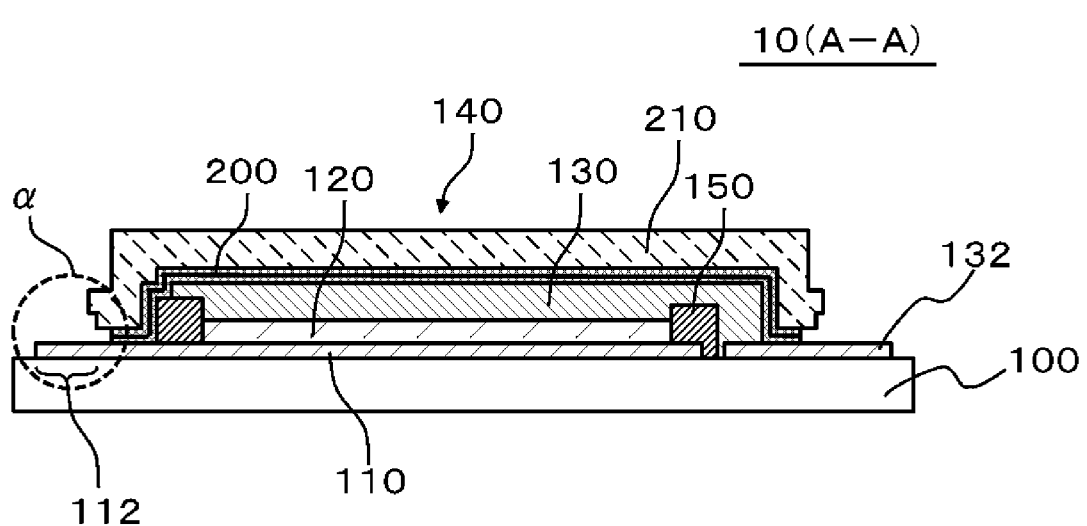
FIG. 4 is a cross-sectional view taken along line A-A of FIG. 1.
Figure 5:
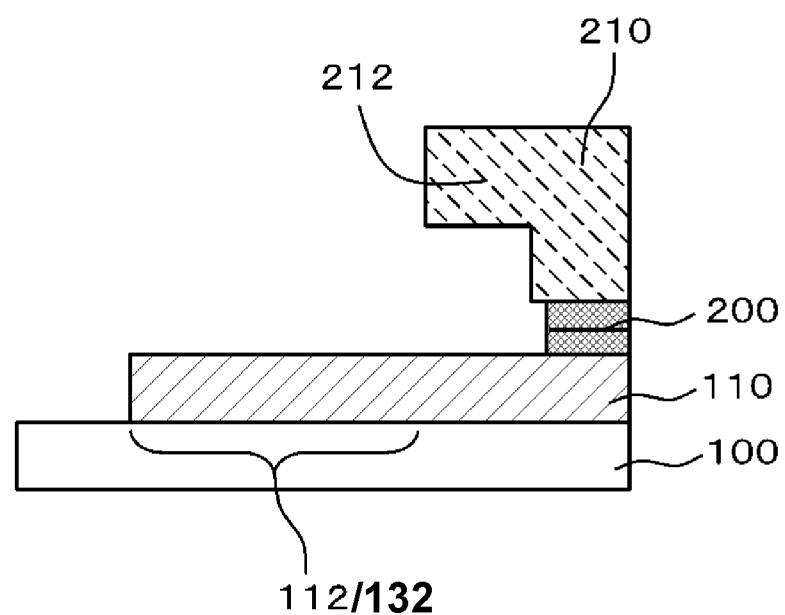
FIG. 5 is an enlarged view of a region surrounded by a dotted line a of FIG. 4.

FIG. 1 is a plan view illustrating a configuration of a light-emitting device 10 according to a first embodiment. FIG. 2 is a diagram in which a cover layer 210, a sealing layer 200, and a second electrode 130 are removed from FIG. 1. FIG. 3 is a diagram in which an insulating layer 150 and an organic layer 120 are removed from FIG. 2. FIG. 4 is a cross-sectional view taken along line A-A of FIG. 1. FIG. 5 is an enlarged view of a region surrounded by a dotted line a of FIG. 4.

As shown in FIGS. 1 and 4, the light-emitting device 10 according to the embodiment includes a substrate 100, a light-emitting unit 140, a first terminal 112, a second terminal 132, a sealing layer 200, and a cover layer 210. The light-emitting unit 140 is formed over a first surface 102 of the substrate 100. The first terminal 112 and the second terminal 132 are formed on the first surface 102 of the substrate 100, and are electrically connected to the light-emitting unit 140. The sealing layer 200 is formed over the first surface 102 of the substrate 100, and seals the light-emitting unit 140. In addition, the sealing layer 200 does not cover the first terminal 112 and the second terminal 132. The cover layer 210 is formed on the sealing layer 200, and is formed of a material different from that of the cover layer 210. As shown in FIGS. 1, 4, and 5, in at least each portion of a region located next to the first terminal 112 and a region located next to the second terminal 132, a portion of the end of the cover layer 210 protrudes from the sealing layer 200, serving as a protrusion 212. In other words, at least a portion of the end of the cover layer 210 is located further outside than the end of the sealing layer 200. The light-emitting device 10 may be an illumination device or a display, FIGS. 1 to 4 indicating an illumination device as the light-emitting device 10. Hereinafter, the detailed description thereof will be given.

First, the light-emitting device 10 will be described with reference to FIGS. 1 to 4.

In a case where the light-emitting device 10 is a bottom-emission type light-emitting device, the substrate 100 is, for example, a glass substrate or a resin substrate which has optical transparency. On the other hand, in a case where the light-emitting device 10 is a top-emission type light-emitting device, the substrate 100 is not required to have optical transparency. In addition, the substrate 100 may have flexibility. In a case where the substrate has flexibility, the thickness of the substrate 100 is, for example, equal to or greater than 10 µm and equal to or less than 1,000 µm. The substrate 100 is polygonal such as, for example, rectangular. In a case where the substrate 100 is a resin substrate, the substrate 100 is formed using, for example, polyethylene naphthalate (PEN), polyether sulphone (PES), polyethylene terephthalate (PET), or polyimide. In addition, in a case where the substrate 100 is a resin substrate, an inorganic barrier film of SiNx, SiON or the like is formed on at least one surface (preferably, both surfaces) of the substrate 100 in order to prevent moisture from permeating the substrate 100. Meanwhile, a planarization layer (for example, organic layer) may be provided between the inorganic barrier film and the substrate 100.

The light-emitting unit 140 is formed over the first surface 102 of the substrate 100. The light-emitting unit 140 has a configuration in which a first electrode 110, the organic layer 120, and the second electrode 130 are laminated in this order.

The first electrode 110 is a transparent electrode having optical transparency. A material of the transparent electrode is a metal oxide formed of a material containing a metal, for example, an indium tin oxide (ITO), an indium zinc oxide (IZO), an indium tungsten zinc oxide (IWZO), a zinc oxide (ZnO) or the like. The thickness of the first electrode 110 is, for example, equal to or greater than 10 nm and equal to or less than 500 nm. The first electrode 110 is formed by, for example, sputtering or vapor deposition. Meanwhile, the first electrode 110 may be formed using a conductive organic material such as carbon nanotubes or PEDOT/PSS.

The organic layer 120 includes a light-emitting layer. The organic layer 120 has a configuration in which, for example, a hole injection layer, a light-emitting layer, and an electron injection layer are laminated in this order. A hole transport layer may be formed between the hole injection layer and the light-emitting layer. In addition, an electron transport layer may be formed between the light-emitting layer and the electron injection layer. The organic layer 120 may be formed by vapor deposition. In addition, at least one layer of the organic layer 120, for example, a layer which is in contact with the first electrode 110 may be formed using a coating method such as ink jet, printing, or spraying. Meanwhile, in this case, the remaining layers of the organic layer 120 are formed using vapor deposition. In addition, all the layers of the organic layer 120 may be formed by a coating method.

The second electrode 130 includes a metal layer constituted of a metal selected from a first group consisting of, for example, Al, Au, Ag (which may be Ag ink or Ag nanowire), Pt, Mg, Sn, Zn, and In, or an alloy of metals selected from the first group. In this case, the second electrode 130 has light shieldingproperties. The thickness of the second electrode 130 is, for example, equal to or greater than 10 nm and equal to or less than 500 nm. However, the second electrode 130 may be formed using a material exemplified as the material of the first electrode 110. The second electrode 130 is formed by, for example, sputtering or vapor deposition.

Meanwhile, the above-described materials of the first electrode 110 and the second electrode 130 are used for the light-emitting device 10 that is a bottom-emission type. In a case where the light-emitting device 10 is a top-emission type, the materials of the first electrode 110 and the materials of the second electrode 130 are reversed. That is, the above-described materials of the second electrode 130 are used as the materials of the first electrode 110, and the above-described materials of the first electrode 110 are used as the materials of the second electrode 130.

The edge of the first electrode 110 is covered with the insulating layer 150. The insulating layer 150 is formed of a photosensitive resin material such as, for example, polyimide, and surrounds a portion of the first electrode 110 which serves as a light-emitting region of the light-emitting unit 140. By providing the insulating layer 150, it is possible to prevent the first electrode 110 and the second electrode 130 from being short-circuited at the edge of the first electrode 110.

In addition, the light-emitting device 10 includes the first terminal 112 and the second terminal 132. The first terminal 112 is connected to the first electrode 110, and the second terminal 132 is connected to the second electrode 130. The first terminal 112 and the second terminal 132 include, for example, a layer formed of the same material as that of the first electrode 110. Meanwhile, an extraction interconnect may be provided between the first terminal 112 and the first electrode 110. In addition, an extraction interconnect may be provided between the second terminal 132 and the second electrode 130.

A positive electrode terminal of a control circuit is connected to the first terminal 112 through a conductive member (an example of an electronic part) such as a bonding wire or a lead terminal, and a negative electrode terminal of the control circuit is connected to the second terminal 132 through a conductive member such as a bonding wire or a lead terminal. However, a circuit element such as a semiconductor package may be directly connected to at least one of the first terminal 112 and the second terminal 132. In addition, the first terminal 112 and the second terminal 132 may be connected to the control circuit through a flexible printed circuit (FPC) substrate. In this case, the first terminal 112 and the second terminal 132 are connected to the FPC through, for example, an anisotropic conductive resin.

The substrate 100 is further provided with the sealing layer 200 and the cover layer 210.

The sealing layer 200 is formed over a surface of the substrate 100 which has the light-emitting unit 140 formed thereon, and covers the light-emitting unit 140. However, the first terminal 112 and the second terminal 132 are not covered with the sealing layer 200. The sealing layer 200 is formed of, for example, an insulating material, more specifically, an inorganic material. In addition, the thickness of the sealing layer 200 is preferably equal to or less than 300 nm. Moreover, the thickness of the sealing layer 200 is, for example, equal to or greater than 50 nm. The sealing layer 200 is formed using atomic layer deposition (ALD). Formation of the sealing layer by ALD allows to improve the step coverage property of the sealing layer 200. However, the sealing layer 200 may be formed using other film formation methods, for example, CVD or sputtering.

The sealing layer 200 may have a multi-layered structure in which plural layers are laminated. In this case, the sealing layer may have a structure in which a first sealing layer constituted of a first material and a second sealing layer constituted of a second material are repeatedly laminated. The lowermost layer may be any of the first sealing layer and the second sealing layer. In addition, the uppermost layer may also be any of the first sealing layer and the second sealing layer. In addition, the sealing film 200 may be a single layer in which the first material and the second material are mixed with each other.

The cover layer 210 protects the sealing layer 200. Specifically, the cover layer 210 is formed in at least a region overlapping the light-emitting unit 140 but does not overlap most of the first terminal 112 and most of the second terminal 132. The cover layer 210 is formed using a thermosetting resin such as an epoxy resin. However, the cover layer 210 may be a photo-curable resin, and may be a film or a metal foil having an adhesive layer. In addition, the cover layer 210 may be a glass plate. The cover layer 210 is thicker than the sealing layer 200. For example, in a case where the cover layer 210 is formed of a resin, the thickness of the cover layer 210 is, for example, equal to or greater than 25 μm and equal to or less than 300 μm.

The edge of the cover layer 210 is located within the region of the sealing layer 200, except for the vicinity of the first terminal 112 and the vicinity of the second terminal 132. However, the edge of the cover layer 210 may also be located outside the edge of the sealing layer 200 in these regions.

Next, a cross-sectional structure of the vicinity of the first terminal 112 will be described with reference to FIG. 5. Meanwhile, a cross-sectional structure of the vicinity of the second terminal 132 is also the same as that of FIG. 5.

As described above, in the region located next to the first terminal 112, the end of the cover layer 210 protrudes from the sealing layer 200 in the outside direction of the light-emitting device 10, and serves as the protrusion 212. In other words, in at least a portion of a region located below the end of the cover layer 210, the sealing layer 200 is not present. The lower surface of the protrusion 212 may not be in contact with either the first electrode 110 or the substrate 100. In the example shown in FIG. 5, the lower surface of at least the end of the protrusion 212 is located higher above compared to a portion of the lower surface of the cover layer 210 which is in contact with the sealing layer 200. This is due to formation of a lift-off layer 220 between the sealing layer 200 and the first terminal 112, described later. However, the stepped portion may be eliminated by subjecting the stepped portion to thermo-compression.

Next, a method of manufacturing the light-emitting device 10 will be described with reference to FIG. 6. First, the first electrode 110 is formed on the substrate 100. In this step, the first terminal 112 and also the second terminal 132 are formed. Next, the insulating layer 150, the organic layer 120, and the second electrode 130 are formed in this order.

Figure 6:
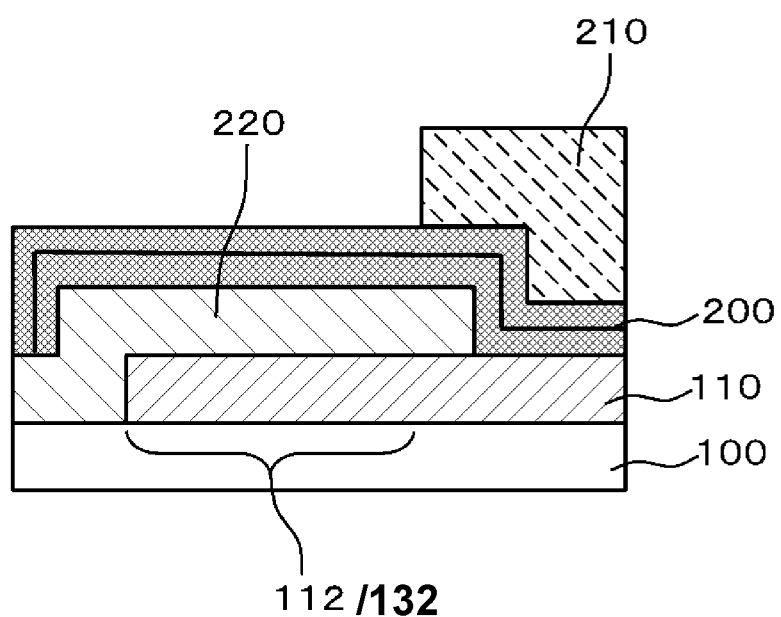
FIG. 6 is a cross-sectional view illustrating a method of manufacturing a light-emitting device.

Next, as shown in FIG. 6, the lift-off layer 220 is formed on the first terminal 112 and the second terminal 132. The lift-off layer 220 is for example, a layer which is removed by a chemical solution or water, and is, for example, a solubilized acrylic-based resin. The thickness of the lift-off layer 220 is, for example, equal to or greater than 1 μm and equal to or less than 5 μm.

Next, the sealing layer 200 is formed using, for example, a film formation method such as CVD, sputtering, or ALD. At this time, the sealing layer 200 is formed over substantially the entire surface of the first surface 102 of the substrate 100, inclusive of a region overlapping the light-emitting unit 140. Therefore, the first terminal 112 and the second terminal 132 are also covered with the sealing layer 200.

Next, a layer serving as the cover layer 210 is formed on the sealing layer 200 using, for example, a coating method. At this time, the layer to serve as the cover layer 210 is made to overlap at least a portion of the lift-off layer 220 (for example, the portion is a region of the edge of the lift-off layer 220 which is located in the vicinity of the light-emitting unit 140). Next, the cover layer 210 is cured. At this time, stress occurs between the sealing layer 200 and the cover layer 210. For this reason, cracking is generated in a region of the lift-off layer 220 which overlaps the sealing layer 200. A part of the cracking is also generated in a portion of the sealing layer 200 which overlaps the lift-off layer 220 but is not covered with the cover layer 210. Particularly, in a case where the cover layer 210 is formed of a thermosetting resin, in this curing step, thermal stress occurs between the sealing layer 200 and the cover layer 210 due to a difference between the coefficients of thermal expansion of materials for forming these layers. For this reason, many cracks are generated in the region of the sealing layer 200 which overlaps the lift-off layer 220.

Next, a portion of the sealing layer 200 which overlaps the first terminal 112 and a portion thereof which overlaps the second terminal 132 are washed by a liquid (chemical solution or water) for dissolving the lift-off layer 220. This liquid reaches the lift-off layer 220 through the cracks formed in the sealing layer 200, and dissolves the lift-off layer 220. Thereby, the portion of the sealing layer 200 which overlaps the first terminal 112 and the portion thereof which overlaps the second terminal 132 are removed. The protrusion 212 is formed in the cover layer 210 at this time.

As stated above, according to the present embodiment, the layer serving as the cover layer 210 overlaps at least a portion of the lift-off layer 220. Therefore, when the cover layer 210 is cured, stress occurs between the lift-off layer 220 and the cover layer 210, and as a result, cracks are generated in a portion of the sealing layer 200 which is located on the lift-off layer 220. Therefore, it is possible to easily remove the portion of the sealing layer 200 which is located on the lift-off layer 220, that is, the portion of the sealing layer 200 which overlaps the first terminal 112 and the portion thereof which overlaps the second terminal 132. As a result, the protrusion 212 is formed in the cover layer 210.

Modification Example 1

Figure 7:
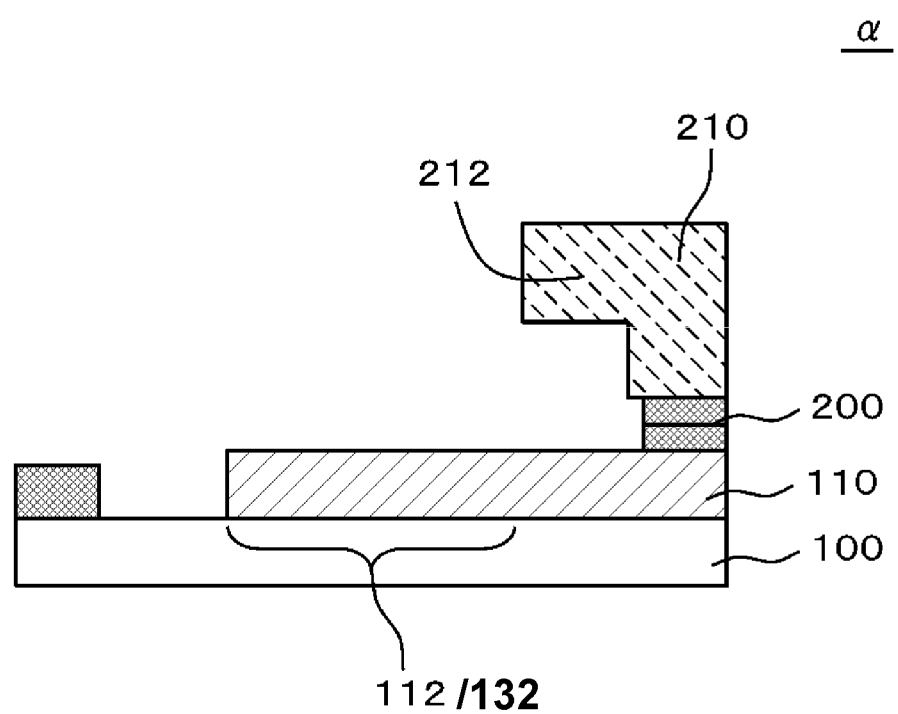
FIG. 7 is a cross-sectional view illustrating a configuration of a light-emitting device according to Modification Example 1.
Figure 8:
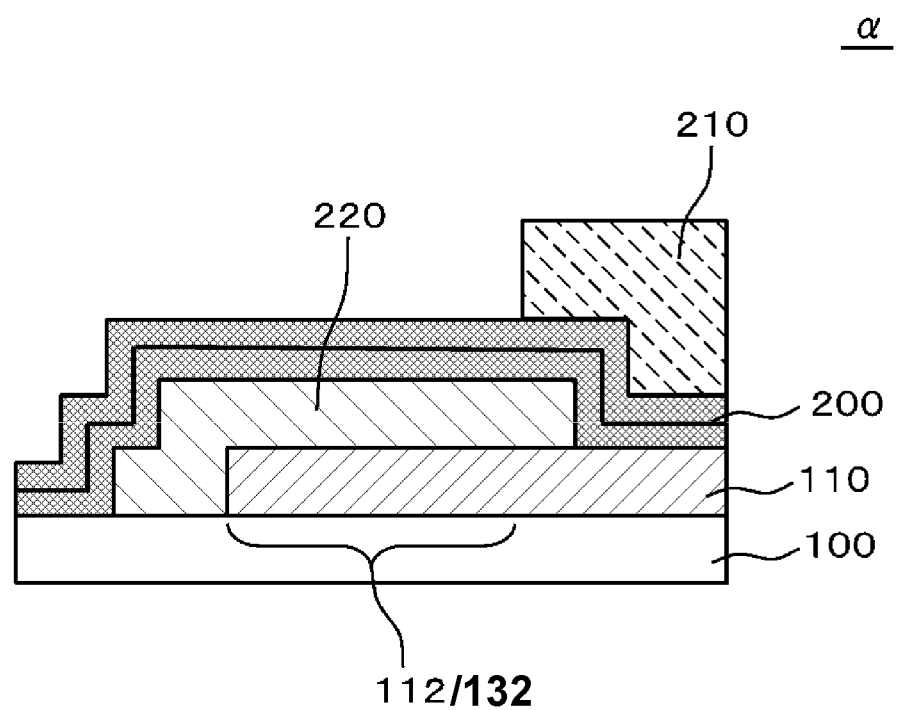
FIG. 8 is a cross-sectional view illustrating a method of manufacturing the light-emitting device according to FIG. 7.

FIG. 7 is a cross-sectional view illustrating a configuration of a light-emitting device 10 according to Modification Example 1, and corresponds to FIG. 5 in the first embodiment. FIG. 8 is a cross-sectional view illustrating a method of manufacturing the light-emitting device 10 shown in FIG. 7, and corresponds to FIG. 6 in the first embodiment.

The light-emitting device 10 according to the present modification example has the same configuration as that of the light-emitting device 10 according to the first embodiment, except that the sealing layer 200 is formed over a region of the substrate 100 which is located around the first terminal 112. In other words, an opening is formed in each of a region of the sealing layer 200 which overlaps the first terminal 112 and a region of the sealing layer 200 which overlaps the second terminal 132. In order to achieve the above, for example, as shown in FIG. 8, the edge of the lift-off layer 220 should be shifted from the edge of the substrate 100. Meanwhile, the vicinity of the second terminal 132 may also have the same structure as that of FIG. 7.

In the present modification example, when the cover layer 210 is cured as is the case with the first embodiment, cracks are also generated in the sealing layer 200. Therefore, it is possible to easily lift off the sealing layer 200 located on the lift-off layer 220.

Modification Example 2

Figure 9:
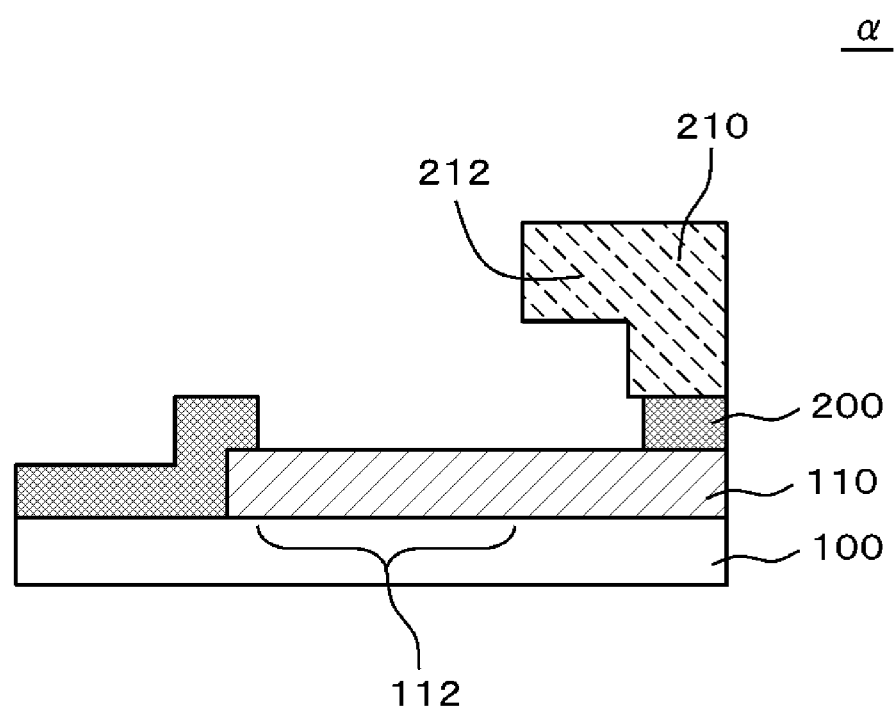
FIG. 9 is a cross-sectional view illustrating a configuration of a light-emitting device according to Modification Example 2.

FIG. 9 is a cross-sectional view illustrating a configuration of a light-emitting device 10 according to Modification Example 2, and corresponds to FIG. 5 in the first embodiment. The light-emitting device 10 according to the present modification example has the same configuration as that of the light-emitting device 10 according to Modification Example 1, except that the sealing layer 200 is formed on the end of the first terminal 112. In order to achieve such a configuration, the edge of the lift-off layer 220 should be shifted from the edge of the first terminal 112. Meanwhile, the vicinity of the second terminal 132 may also have the same structure as that of FIG. 9.

In the present modification example, when the cover layer 210 is cured as is the case with the first embodiment, cracks are also generated in the sealing layer 200. Therefore, it is possible to easily lift off the sealing layer 200 located on the lift-off layer 220.

Modification Example 3

Figure 10:
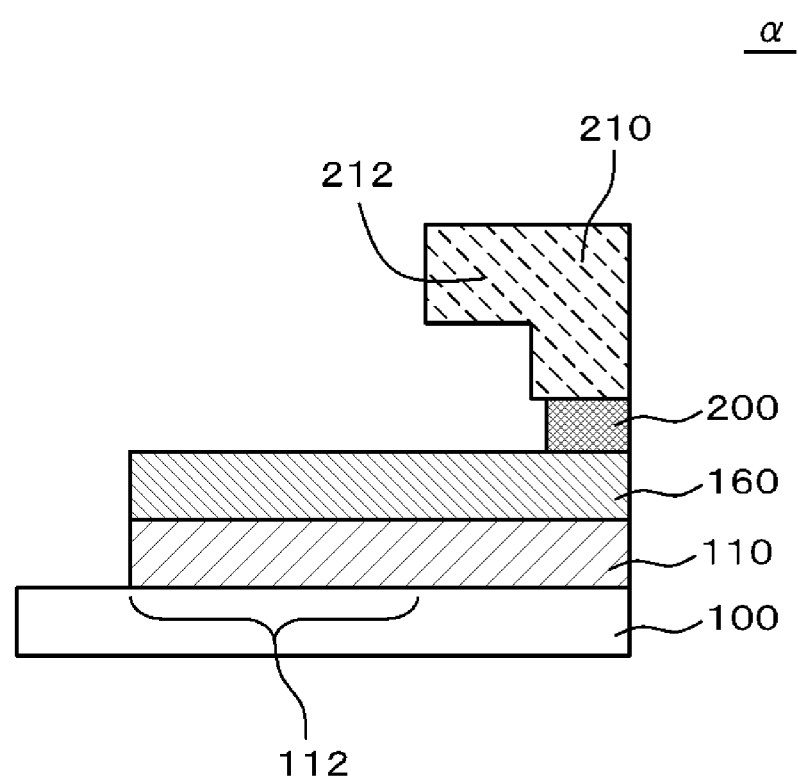
FIG. 10 is a cross-sectional view illustrating a configuration of a light-emitting device according to Modification Example 3.

FIG. 10 is a cross-sectional view illustrating a configuration of a light-emitting device 10 according to Modification Example 3, and corresponds to FIG. 5 in the first embodiment. The light-emitting device 10 according to the present modification example has the same configuration as that of the light-emitting device 10 according to the first embodiment, Modification Example 1, or Modification Example 2, except that the first terminal 112 includes a conductor layer 160. Meanwhile, FIG. 10 shows the same case as that in the first embodiment.

The conductor layer 160 is formed on a layer that continues from the first electrode 110, and is formed of a material having a lower resistance than that of the first electrode 110, for example, a metal or an alloy. The conductor layer 160 is formed, and thus the resistance of the first terminal 112 becomes lower. Meanwhile, the conductor layer 160 may also be formed on the first electrode 110. In this case, plural linear conductor layers 160 are formed on the first electrode 110. These conductor layers 160 function as an auxiliary electrode of the first electrode 110. Thereby, the apparent resistance of the first electrode 110 becomes lower. Meanwhile, the conductor layer 160 may have a multi-layered structure. For example, the conductor layer 160 may have a configuration in which a first layer constituted of Mo or a Mo alloy, a second layer constituted of Al or an Al alloy, and a third layer constituted of Mo or a Mo alloy overlapped in this order. In this case, the thicknesses of the first layer and the third layer are, for example, equal to or greater than 40 nm and equal to or less than 200 nm. In addition, the thickness of the second layer is, for example, equal to or greater than 50 nm and equal to or less than 1,000 nm.

Meanwhile, the second terminal 132 also has a configuration shown in the drawing.

In the present modification example also, when the cover layer 210 is cured as is the case with the first embodiment, cracks are generated in the sealing layer 200. Therefore, it is possible to easily lift off the sealing layer 200 located on the lift-off layer 220. In addition, it is possible to lower the resistance of the first terminal 112 and the resistance of the second terminal 132.

Second Embodiment

Figure 11:
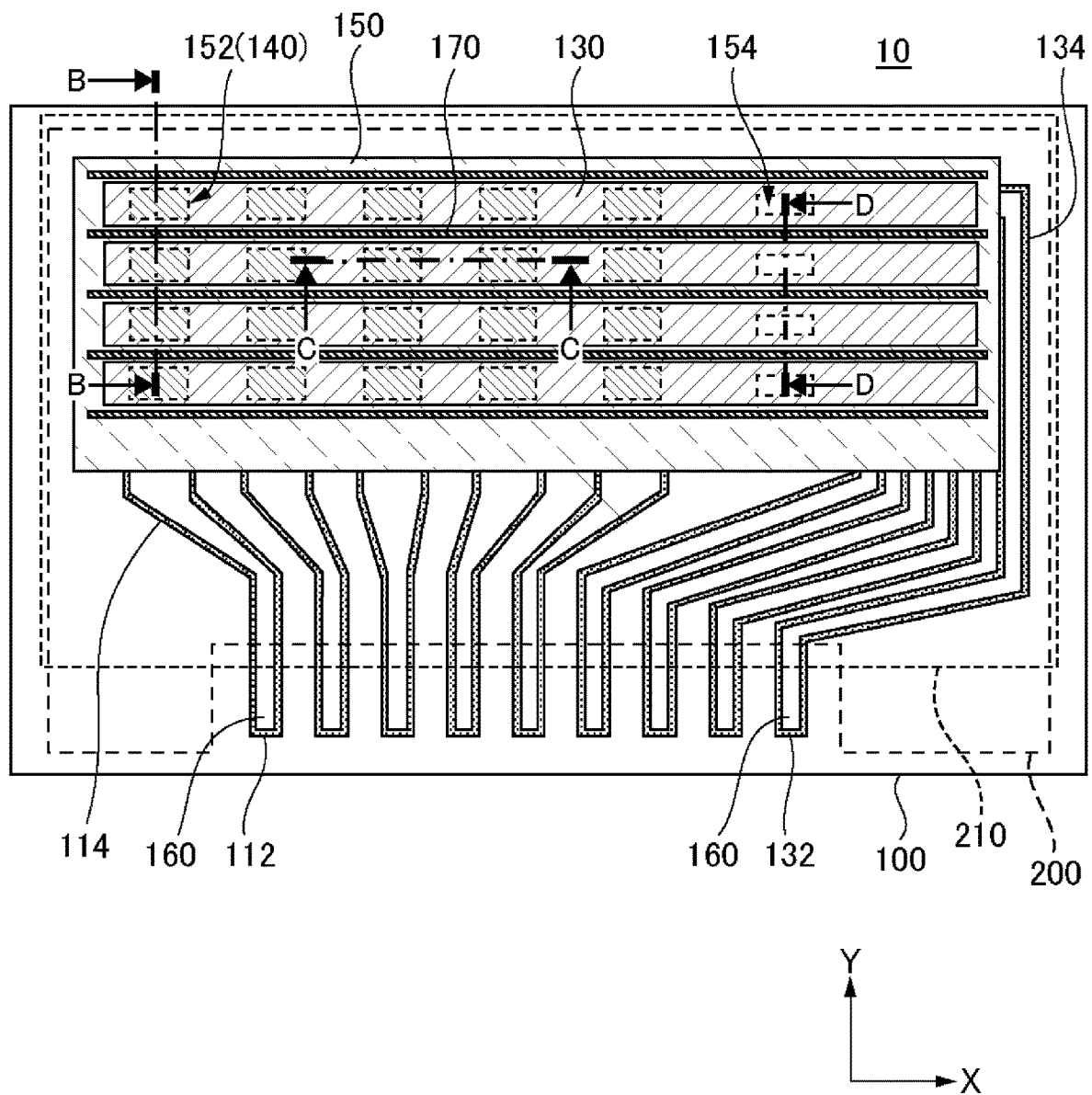
FIG. 11 is a plan view of a light-emitting device according to a second embodiment.
Figure 12:
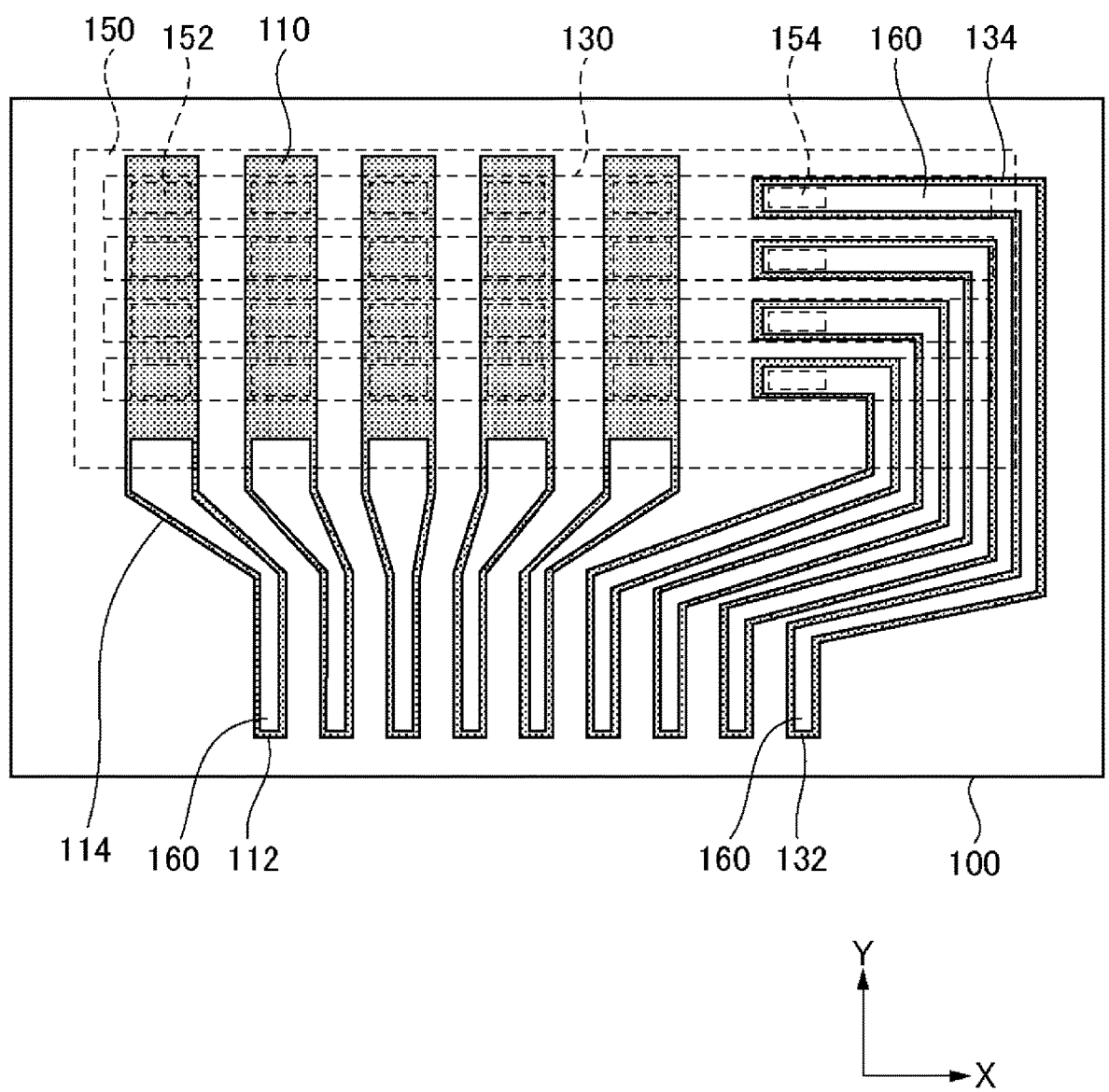
FIG. 12 is a diagram in which a partition wall, a second electrode, an organic layer, and an insulating layer are removed from FIG. 11.
Figure 13:
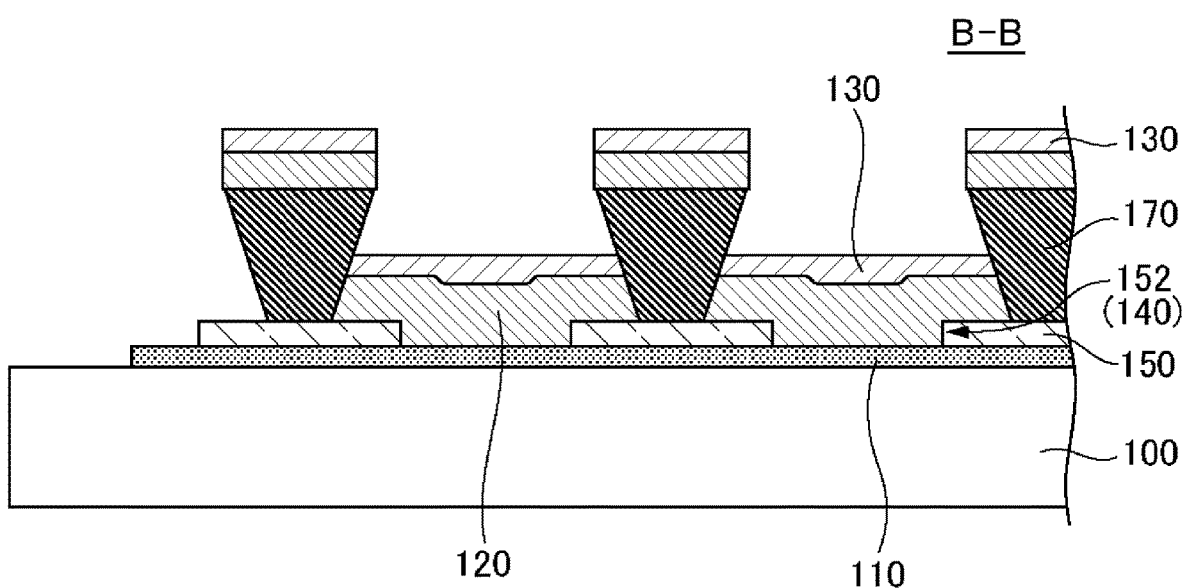
FIG. 13 is a cross-sectional view taken along line B-B of FIG. 11.
Figure 14:
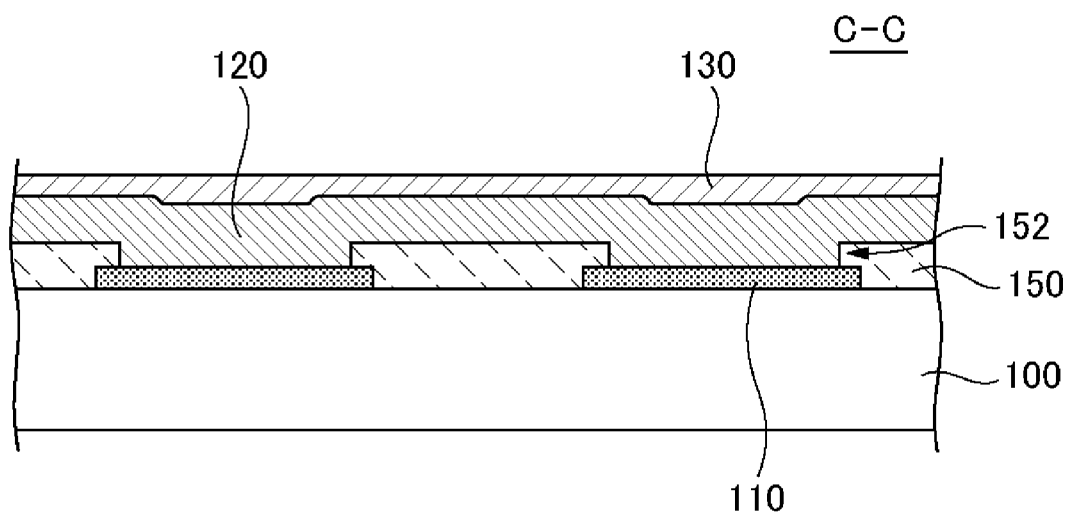
FIG. 14 is a cross-sectional view taken along line C-C of FIG. 11.
Figure 15:
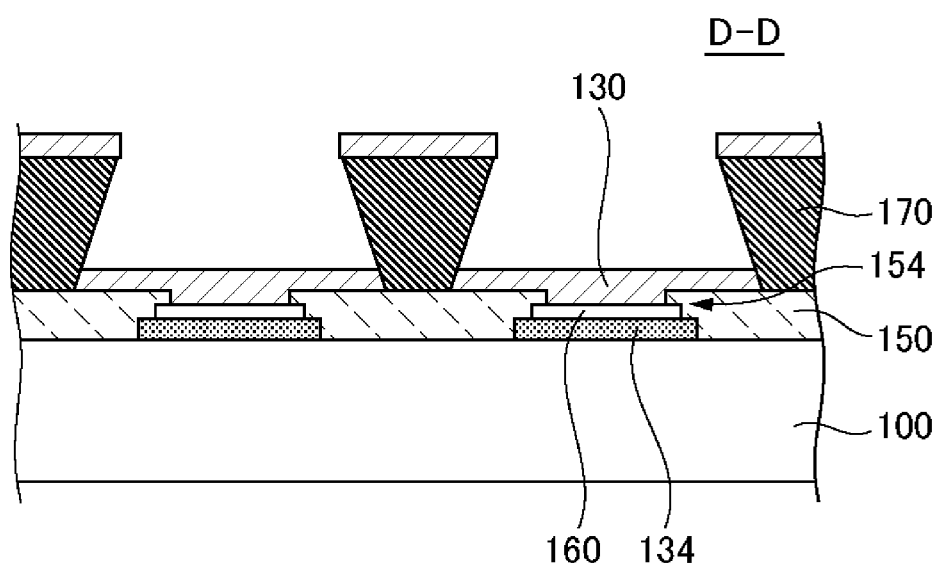
FIG. 15 is a cross-sectional view taken along line D-D of FIG. 11.

FIG. 11 is a plan view of a light-emitting device 10 according to a second embodiment. FIG. 12 is a diagram in which a partition wall 170, the second electrode 130, the organic layer 120, and the insulating layer 150 are removed from FIG. 11. FIG. 13 is a cross-sectional view taken along line B-B of FIG. 11, FIG. 14 is a cross-sectional view taken along line C-C of FIG. 11, and FIG. 15 is a cross-sectional view taken along line D-D of FIG. 11.

The light-emitting device 10 according to the present embodiment is a display, and includes the substrate 100, the first electrode 110, the light-emitting unit 140, the insulating layer 150, plural openings 152, plural openings 154, plural extraction interconnects 114, the organic layer 120, the second electrode 130, plural extraction interconnects 134, and plural partition walls 170.

The first electrode 110 extends linearly in a first direction (Y direction in FIG. 11). The end of the first electrode 110 is connected to the extraction interconnect 114.

The extraction interconnect 114 is an interconnect for connecting the first electrode 110 to the first terminal 112. In the example shown in the drawing, one end side of the extraction interconnect 114 is connected to the first electrode 110, and the other end side of the extraction interconnect 114 serves as the first terminal 112. In the example shown in the drawing, the first electrode 110 and the extraction interconnect 114 are integrally formed. The conductor layer 160 is formed on the extraction interconnect 114. The configuration of the conductor layer 160 is the same as that in Modification Example 3. Meanwhile, a portion of the extraction interconnect 114 is covered with the insulating layer 150.

As shown in FIG. 11 and FIGS. 13 to 15, the insulating layer 150 is formed on plural first electrodes 110 and in a region located therebetween. The plural openings 152 and the plural openings 154 are formed in the insulating layer 150. Plural second electrodes 130 extend in parallel to each other in a direction intersecting the first electrodes 110 (for example, in a direction orthogonal to the first electrode 110: X direction in FIG. 11). The partition wall 170 of which the details will be described later extends between the plural second electrodes 130. The opening 152 is located at the point of intersection between the first electrode 110 and the second electrode 130 when seen in a plan view. Specifically, the plural openings 152 are aligned in the extending direction of the first electrode 110 (Y direction in FIG. 11). In addition, the plural openings 152 are also aligned in the extending direction of the second electrode 130 (X direction in FIG. 11). Therefore, the plural openings 152 are disposed so as to constitute a matrix.

The opening 154 is located in a region overlapping one end side of each of the plural second electrodes 130 when seen in a plan view. In addition, the opening 154 is disposed along one side of the matrix constituted by the openings 152. When seen in a direction (for example, Y direction in FIG. 11, that is, direction along the first electrode 110) along this one side, the openings 154 are disposed at a predetermined interval. A portion of the extraction interconnect 134 is exposed from the opening 154. The extraction interconnect 134 is connected to the second electrode 130 through the opening 154.

The extraction interconnect 134 is an interconnect for connecting the second electrode 130 to the second terminal 132, and includes a layer constituted of the same material as that of the first electrode 110. One end side of the extraction interconnect 134 is located below the opening 154, and the other end side of the extraction interconnect 134 is extracted outside the insulating layer 150. In the example shown in the drawing, the other end side of the extraction interconnect 134 serves as the second terminal 132. The conductor layer 160 is formed on the extraction interconnect 134. The configuration of the conductor layer 160 is the same as that in Modification Example 3. Meanwhile, a portion of the extraction interconnect 134 is covered with the insulating layer 150.

The organic layer 120 is formed in a region overlapping the opening 152. A hole injection layer of the organic layer 120 is in contact with the first electrode 110, and an electron injection layer of the organic layer 120 is in contact with the second electrode 130. Therefore, the light-emitting unit 140 is located in each region overlapping the opening 152.

Meanwhile, in the examples shown in FIGS. 13 and 14, a case is shown in which the respective layers constituting the organic layer 120 all protrude to outside the opening 152. As shown in FIG. 11, the organic layer 120 may or may not be continuously formed between the openings 152 next to each other in a direction in which the partition wall 170 extends. However, as shown in FIG. 15, the organic layer 120 is not formed in the opening 154.

As shown in FIG. 11 and FIGS. 13 to 15, the second electrode 130 extends in a second direction (X direction in FIG. 11) intersecting the first direction. The partition wall 170 is formed between the second electrodes 130 next to each other. The partition wall 170 extends in parallel to the second electrode 130, that is, in the second direction. The foundation of the partition wall 170 is, for example, the insulating layer 150. The partition wall 170 is, for example, a photosensitive resin such as a polyimide-based resin, and is formed in a desired pattern by exposure and development. Meanwhile, the partition wall 170 may be formed of resins other than a polyimide-based resin, for example, an epoxy-based resin or an acrylic-based resin, or an inorganic material such as silicon dioxide.

The partition wall 170 is formed in a shape which is trapezoidal in cross-section and is turned upside down (inverted trapezoid). That is, the width of the upper surface of the partition wall 170 is larger than the width of the lower surface of the partition wall 170. Therefore, when the partition wall 170 is formed prior to the second electrode 130, the plural second electrodes 130 may be collectively formed on one lateral side of the substrate 100 by vapor deposition or sputtering. In addition, the partition wall 170 also has a function of partitioning the organic layer 120.

The light-emitting device 10 of the present embodiment also includes the sealing layer 200 and the cover layer 210. The configurations and layouts of the sealing layer 200 and the cover layer 210 are as shown in the first embodiment or the modification example.

However, in the present embodiment, the first terminal 112 and the second terminal 132 are disposed along the same side of the substrate 100. Therefore, an opening of the sealing layer 200 for exposing the first terminal 112 and an opening thereof for exposing the second terminal 132 are connected to each other.

Next, a method of manufacturing the light-emitting device 10 in the present embodiment will be described. First, the first electrode 110 and the extraction interconnects 114 and 134 are formed on the substrate 100. A method of forming these components is the same as that in the first embodiment.

Next, the conductor layer 160 is formed on the extraction interconnect 114 and the extraction interconnect 134. Then, the insulating layer 150 is formed, and the partition wall 170 is further formed. Next, the organic layer 120 and the second electrode 130 are formed. A method of forming these components is the same as that in the first embodiment.

The lift-off layer 220, the sealing layer 200, and the cover layer 210 are formed in this order. Next, the portion of the sealing layer 200 which overlaps the first terminal 112 and the portion thereof which overlaps the second terminal 132 are removed. These steps are the same as those in the first embodiment.

According to the present embodiment, in a display using the light-emitting unit 140, as is the case with the first embodiment, it is possible to easily remove a portion of the sealing layer 200 which is located on the first terminal 112 and a portion thereof which is located on the second terminal 132.

As described above, although the embodiments of the present invention have been set forth with reference to the accompanying drawings, they are merely illustrative of the present invention, and various configurations other than those stated above can be adopted.

The invention claimed is:

1. A method of manufacturing a light-emitting device, the method comprising:
    forming a light-emitting unit over a first surface of a substrate, the light-emitting unit having a configuration in which a first electrode, an organic layer and a second electrode are laminated in this order;
    forming a terminal electrically connected to the light-emitting unit;
    forming a lift-off layer over the terminal, the lift-off layer not covering the light-emitting unit;
    forming a sealing layer sealing the light-emitting unit and covering the terminal and the lift-off layer;
    forming a cover layer opposite to the substrate across the sealing layer, the cover layer covering a portion of the lift-off layer;
    by dissolving the lift-off layer, removing a portion of the sealing layer in a region overlapping with the terminal and between an end portion of the cover layer and the substrate, to form an edge of the sealing layer,
    wherein, after removing the portion of the sealing layer, the end portion of the cover layer is located outside the edge of the sealing layer, and the end portion of the cover layer is not in contact with a foundation of the sealing layer.

2. The method of manufacturing a light-emitting device according to claim 1,
    wherein, in removing the portion of the sealing layer, the end portion of the cover layer is a protrusion.

3. The method of manufacturing a light-emitting device according to claim 1,
    wherein, in removing the portion of the sealing layer, a gap is formed between the end portion of the cover layer and the substrate.

4. The method of manufacturing a light-emitting device according to claim 1,
wherein the sealing layer has a plurality of layers, and each of the plurality of layers is formed of inorganic material.

5. The method of manufacturing a light-emitting device according to claim 1,
wherein the sealing layer is formed using CVD.

6. The method of manufacturing a light-emitting device according to claim 1,
wherein a portion of a lower surface of the end portion of the cover layer is closer to the first surface of the substrate than an upper surface of the second electrode.

7. The method of manufacturing a light-emitting device according to claim 1, wherein forming the terminal electrically connected to the light-emitting unit comprises:
a first terminal electrically connected to the light-emitting unit;
a second terminal electrically connected to the light-emitting unit;
wherein the lift-off layer is formed over the first terminal and the second terminal,
wherein the sealing layer sealing the light-emitting unit covers the first terminal and second terminal and the lift-off layer, and
wherein by dissolving the lift-off layer, removing a first portion of the sealing layer in a region overlapping with the first terminal and between a first end portion of the cover layer and the substrate and removing a second portion of the sealing layer in a region overlapping with the second terminal and between a second end portion of the cover layer and the substrate, to form a first edge and a second edge of the sealing layer.

8. The method of manufacturing a light-emitting device according to claim 7, further comprising:
forming a first electrode, wherein the first terminal is electrically connected to the first electrode;
forming a second electrode, wherein the second terminal is electrically connected to the second electrode;
forming an insulating layer covering an edge of the first electrode isolating the second electrode and the second terminal.

* * * * *